US009780748B2

(12) United States Patent
Kris et al.

(10) Patent No.: US 9,780,748 B2
(45) Date of Patent: Oct. 3, 2017

(54) SELECTABLE PROGRAMMABLE GAIN OR OPERATIONAL AMPLIFIER

(71) Applicant: Microchip Technology Incorporated, Chandler, AZ (US)

(72) Inventors: Bryan Kris, Gilbert, AZ (US); James E. Bartling, Chandler, AZ (US)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 0 days.

(21) Appl. No.: 14/863,779

(22) Filed: Sep. 24, 2015

(65) Prior Publication Data

US 2016/0094193 A1    Mar. 31, 2016

Related U.S. Application Data

(60) Provisional application No. 62/055,052, filed on Sep. 25, 2014.

(51) Int. Cl.
| | |
|---|---|
| H03F 1/34 | (2006.01) |
| H03G 1/00 | (2006.01) |
| H03F 3/45 | (2006.01) |
| H03G 3/00 | (2006.01) |

(52) U.S. Cl.
CPC ....... H03G 1/0088 (2013.01); H03F 3/45475 (2013.01); H03G 3/001 (2013.01); *H03F 2200/321* (2013.01); *H03F 2203/45048* (2013.01); *H03F 2203/45528* (2013.01); *H03F 2203/45534* (2013.01); *H03F 2203/45616* (2013.01); *H03F 2203/45728* (2013.01)

(58) Field of Classification Search
CPC ...................................................... H03F 1/34
USPC .................................. 330/86, 51, 254, 260, 261
See application file for complete search history.

(56) References Cited

U.S. PATENT DOCUMENTS

| | | | |
|---|---|---|---|
| 6,462,621 B1 | 10/2002 | Charles et al. | 330/282 |
| 7,196,577 B2 * | 3/2007 | Brunner | H03F 1/34 |
| | | | 330/254 |
| 7,973,684 B2 | 7/2011 | Nolan et al. | 341/118 |
| 8,299,850 B1 * | 10/2012 | Kutz | H03K 25/04 |
| | | | 330/260 |
| 8,717,070 B1 | 5/2014 | Klein et al. | 327/108 |
| 9,383,395 B1 * | 7/2016 | Ogirko | G01R 27/2605 |
| 2011/0241916 A1 | 10/2011 | Fletcher et al. | 341/122 |

OTHER PUBLICATIONS

International Search Report and Written Opinion, Application No. PCT/US2015/052138, 12 pages. Dec. 8, 2015.

* cited by examiner

*Primary Examiner* — Henry Choe
(74) *Attorney, Agent, or Firm* — Slayden Grubert Beard PLLC

(57) ABSTRACT

An integrated circuit amplifier configurable to be either a programmable gain amplifier or an operational amplifier comprises two output blocks, one output block is optimized for programmable gain amplifier operation, and the other output block is optimized for operational amplifier applications. A common single input stage, input offset calibration and bias generation circuits are used with either amplifier configuration. Thus duplication of the input stage, offset calibration and bias generation circuits are eliminated while still selectably providing for either a programmable gain amplifier or operational amplifier configuration.

22 Claims, 2 Drawing Sheets

SELECTABLE PROGRAMMABLE GAIN OR OPERATIONAL AMPLIFIER

RELATED PATENT APPLICATION

This application claims priority to commonly owned U.S. Provisional Patent Application No. 62/055,052; filed Sep. 25, 2014; which is hereby incorporated by reference herein for all purposes.

TECHNICAL FIELD

The present disclosure relates to integrated circuit amplifiers, and, in particular, to an integrated circuit amplifier comprising differential inputs, bias circuits, offset calibration circuits, and configuration selectable as either a programmable gain amplifier (PGA) or an operational amplifier (Op-Amp).

BACKGROUND

In small geometry processes, the cost of analog circuitry becomes more expensive because analog active elements do not scale with the process. Customers want maximum flexibility in the usage of analog components. In many circumstances, both programmable gain amplifier (PGA) and operational amplifier (Op-Amp) functions cannot be provided in the same integrated circuit device because of excessive cost to manufacture such a device. Microcontrollers provide for a system on a chip and can integrate many system components within a single integrated circuit, such as processor, memory; and peripheral devices, such as interfaces, analog-to-digital and digital-to analog converters, oscillators, comparators, timers, etc. Microcontrollers, in particular, benefit from the integration of analog amplifiers as peripheral devices. However, such analog amplifiers do not scale with the process as do digital elements.

SUMMARY

Hence there is a need for an integrated circuit amplifier that may be configured as either a programmable gain amplifier (PGA) or an operational amplifier (Op-Amp), and with minimal additional cost and semiconductor die real estate.

According to an embodiment, a configurable amplifier may comprise: a differential input stage; a first output block; a second output block; a plurality of switches coupled to the differential input stage, the first output block and the second output block; wherein the differential input stage and the first output block may be coupled together as a programmable gain amplifier when certain ones of the plurality of switches may be arranged in a first mode, and the differential input stage and the second output block may be coupled together as an operational amplifier when the certain ones of the plurality of switches may be arranged in a second mode.

According to a further embodiment, the first output block may comprise a first intermediate stage and a first output stage, and the second output block may comprise a second intermediate stage and a second output stage. According to a further embodiment, a bias circuit may be coupled to the differential input stage. According to a further embodiment, the bias circuit may have a first set of bias parameters for the programmable gain amplifier configuration when in the first mode, and a second set of bias parameters for the operational amplifier configuration when in the second mode. According to a further embodiment, the first and second bias parameters may be stored in a bias memory. According to a further embodiment, a calibration circuit may be coupled to the differential input stage.

According to a further embodiment, the calibration circuit may have a first set of calibration parameters for the programmable gain amplifier configuration when in the first mode, and a second set of calibration parameters for the operational amplifier configuration when in the second mode. According to a further embodiment, the first and second calibration parameters may be stored in a calibration memory. According to a further embodiment, the first and second calibration parameters each may have an input offset calibration parameter. According to a further embodiment, first and second inputs of the differential input stage may be coupled to first and second external connections of an integrated circuit. According to a further embodiment, an output of the first output block may be coupled to a third external connection of the integrated circuit. According to a further embodiment, an output of the second output block may be coupled to a fourth external connection of the integrated circuit.

According to a further embodiment, a mode selection input may be provided for selecting between the first mode and the second mode. According to a further embodiment, compensation networks may be provided for the first and second output blocks.

According to another embodiment, a microcontroller integrated circuit may comprise: a digital processor and memory; an analog-to-digital converter (ADC) having a digital output coupled to the digital processor; a configurable analog amplifier may comprise: a differential input stage; a first output block; a second output block; a plurality of switches coupled to the differential input stage, the first output block and the second output block; wherein the differential input stage and the first output block may be coupled together as a programmable gain amplifier when certain ones of the plurality of switches may be arranged in a first mode, and the differential input stage and the second output block may be coupled together as an operational amplifier when the certain ones of the plurality of switches may be arranged in a second mode; and the processor controls the first and second modes.

According to a further embodiment, a multiplexer may be coupled between the first output block and the ADC. According to a further embodiment, a configuration register may be provided for storing open and close settings of the plurality of switches for the first and second modes. According to a further embodiment, an integrated circuit package may have a plurality of external connections thereon.

According to a further embodiment, first and second inputs of the differential input stage may be coupled to first and second ones of the plurality of external connections. According to a further embodiment, an output of the first output block may be coupled to a third one of the plurality of external connections. According to a further embodiment, an output of the second output block may be coupled to a fourth one of the plurality of external connections. According to a further embodiment, a mode selection input may be provided for selecting between the first mode and the second mode. According to a further embodiment, a fifth one of the plurality of external connections may be coupled to the mode selection input.

According to yet another embodiment, a method for configuring an amplifier as a programmable gain amplifier or an operational amplifier may comprise the steps of: providing a differential input stage; providing a first output block having an input switchably coupled to an output of the differential input stage; providing a second output block having an input switchably coupled to the output of the differential input stage; and providing a plurality of switches coupled to the differential input stage, and the first and second output blocks; coupling the differential input stage and the first output block together as a programmable gain amplifier when the plurality of switches may be arranged in a first mode; and coupling the differential input stage and the second output block together as an operational amplifier when the plurality of switches may be arranged in a second mode.

According to a further embodiment of the method, may comprise the step of storing bias parameters for the differential input stage in a bias memory for the first and second modes. According to a further embodiment of the method, may comprise the step of storing input offset calibration parameters for the differential input stage in an offset memory for the first and second modes.

BRIEF DESCRIPTION OF THE DRAWINGS

A more complete understanding of the present disclosure may be acquired by referring to the following description taken in conjunction with the accompanying drawings wherein.

Figure 1:
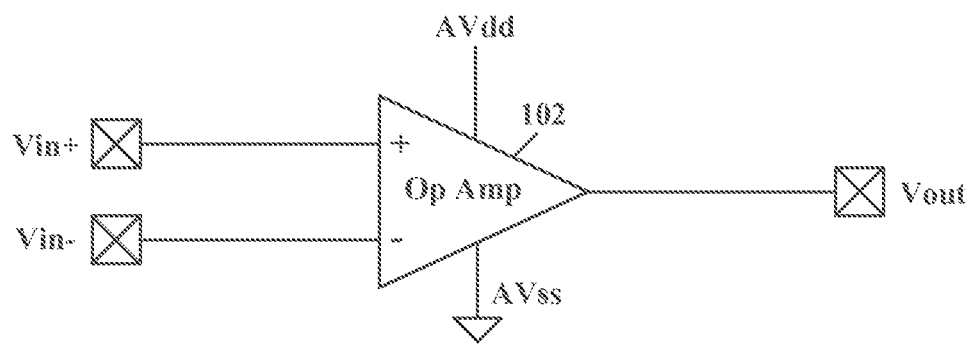
FIG. 1 illustrates a schematic diagram of an operational amplifier (Op-Amp), according to the teachings of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

DETAILED DESCRIPTION

According to various embodiments of this disclosure, an integrated circuit amplifier having two intermediate and two output stages, one intermediate and output stage are optimized for programmable gain amplifier (PGA) operation, and the other intermediate and output stage are optimized for operational amplifier (Op-Amp) applications. A common single input stage, input offset calibration and bias generation circuits may be used with either the PGA or Op-Amp configuration. Thus duplication of the input stage, offset calibration and bias generation circuits are eliminated.

According to various embodiments of this disclosure, the cost of another amplifier input stage, input offset calibration circuitry, and bias generation circuitry can be saved by not having to duplicate them for each of the amplifier configurations, e.g., PGA or Op-Amp configuration. These circuits represent about eighty percent of the total cost of either a PGA or an Op-Amp, so the various embodiments according to this disclosure, can save a significant amount of manufacturing cost of and device fabrication on a mixed signal integrated circuit.

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a schematic diagram of an operational amplifier (Op-Amp), according to the teachings of this disclosure. Analog amplifiers are desirable peripheral devices in many microcontrollers. FIG. 1 shows a conventional operational amplifier (Op-Amp) 102 that can be used in a microcontroller integrated circuit. The Op-Amp 102 has flexible usage, generally about 10 MHz of bandwidth, in a microcontroller integrated circuit the Op-Amp 102 may be integrated as a peripheral device and would then require only 3 external integrated circuit package connections (pins). An Op-Amp 102 typically uses a large output driving structure for coupling to external low impedance loads. The Op Amp 102 may comprise differential inputs, Vin+ and Vin−, and a single ended output, Vout.

Typical applications for an Op-Amp 102, integrated with a microcontroller, may be for example but not limited to controlling functions such as motor control. In motor control applications a three node Op-Amp 102, having two input nodes and one output node provides for maximum design flexibility. Motor applications, generally, have a limited bandwidth requirement of, for example but not limited to, a 10 MHz gain bandwidth (GBW) and the output driver has high current capacity to handle higher current draw loads external from the microcontroller integrated circuit.

Figure 2:
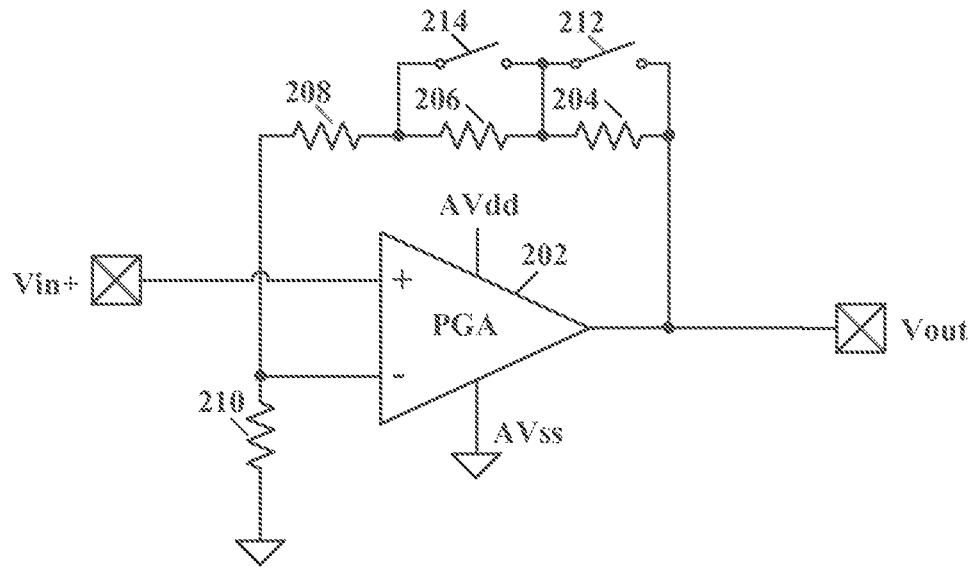
FIG. 2 illustrates a schematic diagram of a programmable gain amplifier (PGA), according to the teachings of this disclosure.

Referring to FIG. 2, depicted is a schematic diagram of a programmable gain amplifier (PGA), according to the teachings of this disclosure. A PGA 202 provides design flexibility with easy and cost effective implementation in an analog signal application. FIG. 2 shows a conventional PGA that may be used in a microcontroller integrated circuit. The PGA 202 comprises a single input gain block that may have a gain bandwidth (GBW) of about 100 MHz. In a microcontroller application, the output signal from the PGA may be used internally and therefore such a device would require only one external integrated circuit package connection (pin). Generally the PGA is provided with a small output driver for driving low power internal analog circuits, e.g., multiplexer, sample and hold, analog-to-digital converter (ADC), etc., in microcontroller applications.

The PGA 202 comprises a differential input amplifier configured as a non-inverting single input amplifier having selectable gains provided by feedback loop resistors 204, 206, 208 and 210, where different combinations of the resistors 204 206 and 208 may be used for selection of different fixed gains. Shown are two gain selection switches 212 and 214 that switch in and out resistors 204 and 206, respectively, of the feedback loop to provide up to four different fixed gains.

The PGA 202 uses one input for an analog signal that may be referenced to a power supply common or ground. The output of the PGA 202, generally, is internally coupled to another analog circuit, e.g., an analog-to-digital converter or to an input of an analog multiplexer having an output to the analog-to-digital converter (ADC), or to a sample-and-hold circuit between the ADC and the PGA 202 output. Therefore no external integrated circuit package connection may be needed for utilization of the PGA 202 output. Therefore only one external package connection (pin) may be necessary, thereby minimizing the microcontroller integrated circuit package pin-count.

Typical applications for the PGA 202, integrated with a microcontroller, may be, for example but not limited to, analog data acquisition, switch mode power supply (SMPS) voltage and current feedback measurements. In the SMPS applications an external one-pin PGA 202 may be all that is required. When coupled to an output of an analog multiplexer in the microcontroller integrated circuit, no external connect thereto is required. Also, a PGA 202 may be used in combination with an analog-to-digital converter (e.g., with a sample and hold circuit). Output signals from the PGA 202 are generally not required to be used externally to the microcontroller package and a signal being amplified by the PGA 202 is often measured with respect to ground, therefor only one external input (pin) for operation of the PGA 202 is necessary which minimizes the microcontroller integrated circuit package pin-count. However, it is generally too expensive to have both types of amplifiers, PGA and Op-Amp, provided in a microcontroller integrated circuit device. As mentioned above, analog circuitry does not scale with process and small processes are expensive. In addition, high output drive and large bandwidth capabilities require a large semiconductor die area and high power consumption.

Figure 3:
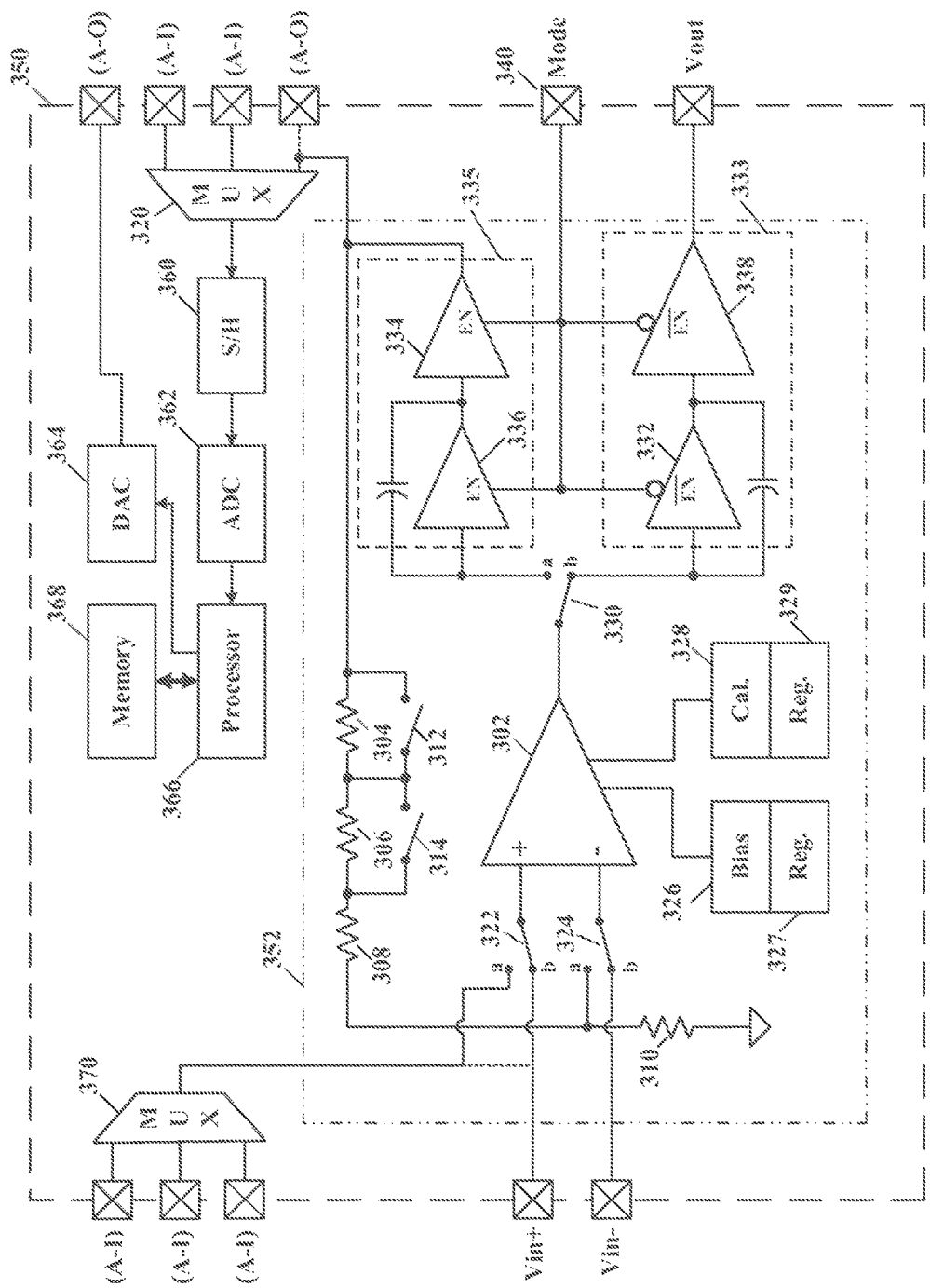
FIG. 3 illustrates a schematic and block diagram of a microcontroller comprising an amplifier configurable as either a programmable gain amplifier (PGA) or an operational amplifier (Op-Amp), according to a specific example embodiment of this disclosure.

Referring to FIG. 3, depicted is a schematic and block diagram of a microcontroller comprising an amplifier configurable as either a programmable gain amplifier (PGA) or an operational amplifier (Op-Amp), according to a specific example embodiment of this disclosure. A mixed signal (analog and digital) microcontroller 350 may comprise an analog amplifier 352 configurable as either a programmable gain amplifier (PGA) or an operational amplifier (Op-Amp), a digital processor 366 coupled with a program and data storage memory 368, a digital-to-analog converter (DAC) 364, an analog-to-digital converter (ADC) 362 having an output coupled to the digital processor 366, a sample-and-hold circuit 360 coupled to an input of the ADC 362, and multiplexers 320 and 370. More or fewer number of multiplexers, DAC, and ADC are contemplated herein, according to the teachings of this disclosure. The processor 366, generally, will have control over the aforementioned circuit functions. A plurality of external connections on the microcontroller integrated circuit may be provided for power and ground (not shown), and analog and digital inputs and outputs. These external connections may also be coupled to switch circuits (not shown) that may be programmed to further couple the respective external connections to an input or an output if an internal circuit function, e.g., ADC, DAC, multiplexers and serial communications.

The configurable analog amplifier 352 may comprise a differential input stage 302 and associated configuration logic and switch circuitry, such as, for example, switches 304, 306, 308, 322, 324 and 330; resistors 304, 306, 308 and 310; a bias circuit 326, a bias register 327, a calibration circuit 328, a calibration register 329. Furthermore, a first output block 335 and a second output block 333 which are independent from each other are provided. According to one embodiment each output block 335 and 333 may comprise a first intermediate stage 336 coupled with a first output stage 334, and a second intermediate stage 332 coupled with a second output stage 338, respectively. However, other embodiments may comprise a single combined output stage or more stages in each or one of the output blocks 335 and 333.

In the Op-Amp 102 and PGA 202 circuits shown in FIGS. 1 and 2 the input, bias and calibration circuits are not affected operationally by the output amplifier circuits. Predominately they are a differential input circuit, and overhead circuits that may provide bias and offset calibration for the differential input circuit. For a more detailed description of a differential input amplifier having auto input offset calibration, see commonly owned U.S. Pat. No. 7,973,684 B2, entitled "Self Auto-Calibration of Analog circuits in a Mixed Signal Integrated Circuit Device," by James B. Nolan and Kumen Blake; and incorporated by reference herein for all purposes.

Therefore it is desired to minimize additional duplicative instances of amplifier circuit "overhead" in a microcontroller integrated circuit. As such only one differential input stage 302 is required. The differential input stage 302 may have its parameters and characteristics, such as bias and offset calibration, provided by one bias circuit 326 and one calibration (e.g., input offset calibration) circuit 328. Wherein the unique bias and calibration parameters for each amplifier configuration, Op-Amp or PGA, may be stored in bias and calibration registers (e.g., memories) 327 and 329, respectively.

In FIG. 3, according to one embodiment, an amplifier 352 is shown with two sets of intermediate stages 336 and 332, and two sets of output stages 334 and 338, one set (336, 334) is optimized for PGA like operation, the other set (332, 338) is optimized for Op-Amp like operation. However, as stated above, the two output blocks 335 and 333 may be configured differently. The PGA set (336, 334) may be high speed (e.g., 100 MHz GBW) but has no significant output drive capability, the Op-Amp set (332, 338) is lower speed (e.g., 10 MHz GBW) but has good external load drive capability. Each intermediate and output set may have their own compensation networks to insure stable operation thereof. A configuration register(s) (not shown) may be implemented to provide independent configuration parameters for the Op-Amp and PGA configurations such as, for example but not limited to, mode, gain, offset calibration, etc.

A "mode" control signal 340 may be used to select either the Op-Amp or PGA configuration desired and enable the appropriate sections of the amplifier 352. The mode control signal 340 input may be external in one embodiment, and in another embodiment it may be controlled internally without needing an external control connection. In a further embodiment both of the aforemented mode control signal 340 connections may be available for a designer/user to select whether an internal or external control input is used.

In the alternative, a device configuration register (not shown) may be used to select which amplifier configuration is desired along with other microcontroller configuration parameters like input-output types, multiplexer/ADC/DAC and internal switches as needed, e.g., switches 312, 314, 322, 324 and 330, for either PGA or Op-Amp Mode arrangements and the like. A device configuration register (not shown) may be accessed through a serial port (not shown) that may be used by the microcontroller for a number of other purposes. The various embodiments disclosed herein provide for maximum application flexibility and require minimal additional cost and integrated circuit die real estate. The switches 312, 314, 322, 324 and 330 may be field effect transistors.

According to some embodiments, one, two or three nodes of the amplifier 352 may be coupled externally in either operating mode thereof. For example, a device configuration register (not shown but the same or similar to the one described above) may be provided that allows selecting which nodes of the amplifier 352 will be coupled with which external connections (pins) of the microcontroller 350 IC package. The assignment to external pins can also be fixed depending on the operating mode, such as three (3) pins may be assigned externally in the Op-Amp operating mode and only one or two pins assigned in the PGA operating mode of the amplifier 352.

When switches 322, 324 and 330 are in the "b" position (as shown in FIG. 3) and the mode selection signal 340 is low, thereby enabling the second output block 333, the amplifier 352 is configured as an Op-Amp. As such the positive (+) input of the differential input stage 302 is coupled to the Vin+ external connection, the negative (−) input of the differential input stage 302 is coupled to the Vin− external connection, the output of the differential input stage 302 is coupled to the input of the second output block 333, and the output of the second output block 333 is coupled to the Vout external connection. Thus a standard Op-Amp configuration is provided in the microcontroller 350 with all necessary connections thereto provided as two external inputs (Vin+, Vin−) and one external output (Vout). The second output block 333 generally has higher output capabilities because the second output stage 338 has greater current handling capacity and be able to drive more external loads than the smaller capacity first output stage 334 used in the PGA configuration.

When switches 322, 324 and 330 are in the "a" position and the mode selection signal 340 is high, thereby enabling the first output block 335, the amplifier 352 is configured as a programmable gain amplifier (PGA). In one embodiment, only the positive (+) input of the differential input stage 302 is coupled to the output of a multiplexer 370, or in another embodiment to the Vin+ external connection (shown as a dotted line). The multiplexer 370 may have a plurality of analog inputs coupled to a plurality of external connections. Selection of any one of these plurality of analog inputs (A-I) may then be provided to the positive (+) input of the differential input stage 302. The negative (−) input of the differential input stage 302 is coupled to the gain setting feedback network resistors 310 and 308, with the other two gain setting feedback resistors 306 and 304 being switched in or out of the gain setting feedback network with switches 314 and 312, respectively.

In one embodiment the output of the first output block 335 is coupled to the gain setting feedback network resistor 304 and to an input of a multiplexer 320. In another embodiment the output of the first output block 335 is coupled to the resistor 304 and, optionally, may be coupled to an analog output external connection (A-O) with or without being coupled to the input of the multiplexer 320 (shown as a dotted line in FIG. 3). When Being coupled to an input of the multiplexer 320 the drive capability of the first output block 335 need not be as great as the output drive capability of the second output block 333 (Op-Amp) which generally is used to drive an external load(s). A plurality of analog inputs through external connections (A-I) may be provided to the multiplexers 320 and 370. The multiplexers 320 and 370 may be controlled by the processor 366. Analog signal outputs, e.g., DAC 364, output from the second output block 333 (Vout), output from the first output block 335; may be coupled to external connections (A-O). Not shown but contemplated herein are external connections for digital inputs (D-I) and outputs (D-O), as well as configurable analog input-outputs (A-I/O) and digital inputs-outputs (D-I/O). External connections not needed for operation of the configurable analog amplifier 352 mode selected may be used for other signal/function purposes through respective input-output configuration multiplexers (not shown) that may be controlled by the processor 366.

The invention claimed is:

1. A configurable amplifier, comprising:
a differential input stage and a bias circuit coupled to the differential input stage;
a first output block;
a second output block;
a feedback network; and
a plurality of switches coupled to the differential input stage, the feedback network, the first output block and the second output block;
wherein
the differential input stage, the feedback network, and the first output block are coupled together as a programmable gain amplifier when certain ones of the plurality of switches are arranged in a first mode,
the differential input stage and the second output block are coupled together as an operational amplifier without any feedback network when the certain ones of the plurality of switches are arranged in a second mode, and
wherein the bias circuit has a first set of bias parameters for the programmable gain amplifier configuration when in the first mode, and a second set of bias parameters for the operational amplifier configuration when in the second mode.

2. The configurable amplifier according to claim 1, wherein the first output block comprises a first intermediate stage and a first output stage, and the second output block comprises a second intermediate stage and a second output stage.

3. The configurable amplifier according to claim 1, wherein the first and second bias parameters are stored in a bias memory.

4. The configurable amplifier according to claim 1, further comprising a calibration circuit coupled to the differential input stage.

5. The configurable amplifier according to claim 3, wherein the calibration circuit has a first set of calibration parameters for the programmable gain amplifier configuration when in the first mode, and a second set of calibration parameters for the operational amplifier configuration when in the second mode.

6. The configurable amplifier according to claim 4, wherein the first and second calibration parameters are stored in a calibration memory.

7. The configurable amplifier according to claim 3, wherein the first and second calibration parameters each have an input offset calibration parameter.

8. The configurable amplifier according to claim 1, wherein first and second inputs of the differential input stage are coupled to first and second external connections of an integrated circuit when operating in said second mode and only one of the first and second inputs of the differential input stage is coupled to another external connection of an integrated circuit when operating in said first mode.

9. The configurable amplifier according to claim 8, wherein an output of the first output block is coupled to a third external connection of the integrated circuit.

10. The configurable amplifier according to claim 8, wherein an output of the second output block is coupled to a fourth external connection of the integrated circuit.

11. The configurable amplifier according to claim 1, further comprising a mode selection input for selecting between the first mode and the second mode.

12. The configurable amplifier according to claim 1, further comprising compensation networks for the first and second output blocks.

13. A microcontroller integrated circuit, comprising:
a digital processor and memory;
an analog-to-digital converter (ADC) having a digital output coupled to the digital processor;
a configurable analog amplifier, comprising:

a differential input stage;
a feedback network;
a first output block;
a second output block;
a plurality of switches coupled to the differential input stage, the feedback network, the first output block and the second output block;
and a multiplexer coupled between the first output block and the ADC;
wherein
the differential input stage, the feedback network, and the first output block are coupled together as a programmable gain amplifier when certain ones of the plurality of switches are arranged in a first mode, and
the differential input stage and the second output block are coupled together as an operational amplifier without any feedback network when the certain ones of the plurality of switches are arranged in a second mode; and
the processor controls the first and second modes.

14. A microcontroller integrated circuit, comprising:
a digital processor and memory;
an analog-to-digital converter (ADC) having a digital output coupled to the digital processor;
a configurable analog amplifier, comprising:
a differential input stage;
a feedback network;
a first output block;
a second output block;
a plurality of switches coupled to the differential input stage, the feedback network, the first output block and the second output block;
wherein
the differential input stage, the feedback network, and the first output block are coupled together as a programmable gain amplifier when certain ones of the plurality of switches are arranged in a first mode, and
the differential input stage and the second output block are coupled together as an operational amplifier without any feedback network when the certain ones of the plurality of switches are arranged in a second mode; and
the processor controls the first and second modes;
wherein the microcontroller further comprises a configuration register for storing open and close settings of the plurality of switches for the first and second modes.

15. The microcontroller according to claim 14, further comprising an integrated circuit package having a plurality of external connections thereon.

16. The microcontroller according to claim 15, wherein first and second inputs of the differential input stage are coupled to first and second ones of the plurality of external connections when operating in said second mode and only one of the first and second inputs of the differential input stage is coupled to another external connection of an integrated circuit when operating in said first mode.

17. The microcontroller according to claim 15, wherein an output of the first output block is coupled to a third one of the plurality of external connections.

18. The microcontroller according to claim 15, wherein an output of the second output block is coupled to a fourth one of the plurality of external connections.

19. The microcontroller according to claim 15, further comprising a mode selection input for selecting between the first mode and the second mode.

20. The microcontroller according to claim 19, further comprising a fifth one of the plurality of external connections coupled to the mode selection input.

21. A method for configuring an amplifier as a programmable gain amplifier with a feedback network or an operational amplifier without any feedback network, said method comprising the steps of:
providing a differential input stage;
providing the feedback network;
providing a first output block having an input switchably coupled to an output of the differential input stage;
providing a second output block having an input switchably coupled to the output of the differential input stage; and
providing a plurality of switches coupled to the differential input stage, and the first and second output blocks;
coupling the differential input stage, the feedback network, and the first output block together as the programmable gain amplifier when the plurality of switches are arranged in a first mode;
coupling the differential input stage and the second output block together as an operational amplifier without any feedback network when the plurality of switches are arranged in a second mode, and
storing input offset calibration parameters for the differential input stage in an offset memory for the first and second modes.

22. The method according to claim 21, further comprising the step of storing bias parameters for the differential input stage in a bias memory for the first and second modes.

* * * * *